(12) United States Patent
Tsai et al.

(10) Patent No.: US 9,765,289 B2
(45) Date of Patent: Sep. 19, 2017

(54) CLEANING METHODS AND COMPOSITIONS

(75) Inventors: Hui-Jung Tsai, Hsin-Chu (TW); Hung-Jui Kuo, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 816 days.

(21) Appl. No.: 13/598,272

(22) Filed: Aug. 29, 2012

(65) Prior Publication Data

US 2013/0276837 A1    Oct. 24, 2013

Related U.S. Application Data

(60) Provisional application No. 61/635,098, filed on Apr. 18, 2012.

(51) Int. Cl.
*B08B 3/00* (2006.01)
*C11D 11/00* (2006.01)
(Continued)

(52) U.S. Cl.
CPC ............ *C11D 11/0047* (2013.01); *C11D 7/06* (2013.01); *C11D 7/3218* (2013.01); *H01L 21/02071* (2013.01); *H01L 21/67051* (2013.01); *H01L 24/03* (2013.01); *H01L 24/05* (2013.01); *H01L 24/11* (2013.01); *H01L 24/13* (2013.01); *H01L 2224/03912* (2013.01); *H01L 2224/0401* (2013.01); *H01L 2224/05572* (2013.01); *H01L 2224/05583* (2013.01); *H01L 2224/05644* (2013.01); *H01L 2224/05647* (2013.01); *H01L 2224/1145* (2013.01); *H01L 2224/1147* (2013.01); *H01L 2224/1181* (2013.01); *H01L 2224/11452* (2013.01); *H01L 2224/11462* (2013.01); *H01L 2224/13005* (2013.01); *H01L 2224/13083* (2013.01); *H01L 2224/13111* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01);
(Continued)

(58) Field of Classification Search
CPC ......... H01L 21/67051; H01L 21/02071; C11D 11/0047; C11D 7/06; C11D 7/3218
See application file for complete search history.

(56) References Cited

U.S. PATENT DOCUMENTS 4,027,686 A * 6/1977 Shortes et al. .................. 134/33
6,106,635 A * 8/2000 Hamada et al. ................. 134/33
(Continued)

OTHER PUBLICATIONS 2-(2-Aminoethoxy)ethanol, Sigma Aldrich, Oct. 19, 2015, pp. 1-3.*

*Primary Examiner* — Bibi Carrillo
(74) *Attorney, Agent, or Firm* — Slater Matsil, LLP

(57) ABSTRACT

Methods and chemical solvents used for cleaning residues on metal contacts during a semiconductor device packaging process are disclosed. A chemical solvent for cleaning a residue formed on a metal contact may comprise a reactive inorganic component and a reactive organic component. The method may comprise spraying a semiconductor device with a chemical solvent at a first pressure, and spraying the semiconductor device with the chemical solvent at a second pressure less than the first pressure.

20 Claims, 4 Drawing Sheets

(51) Int. Cl.
    *H01L 21/67*     (2006.01)
    *H01L 21/02*     (2006.01)
    *C11D 7/06*     (2006.01)
    *C11D 7/32*     (2006.01)
    *H01L 23/00*     (2006.01)

(52) U.S. Cl.
    CPC ........ *H01L 2224/13155* (2013.01); *H01L 2224/13157* (2013.01); *H01L 2224/13169* (2013.01); *H01L 2224/13171* (2013.01); *H01L 2224/13172* (2013.01); *H01L 2224/13184* (2013.01); *H01L 2924/00014* (2013.01)

(56) References Cited

U.S. PATENT DOCUMENTS

| | | | |
|---|---|---|---|
| 6,286,525 B1 * | 9/2001 | Nishimura et al. | 134/95.3 |
| 6,436,226 B1 * | 8/2002 | Omi et al. | 156/701 |
| 7,655,496 B1 * | 2/2010 | Franklin et al. | 438/72 |
| 2004/0211440 A1 * | 10/2004 | Wang et al. | 134/2 |
| 2006/0000493 A1 * | 1/2006 | Steger et al. | 134/33 |
| 2010/0056410 A1 * | 3/2010 | Visintin et al. | 510/176 |
| 2013/0116159 A1 * | 5/2013 | Pollard | C11D 1/72 510/176 |

* cited by examiner

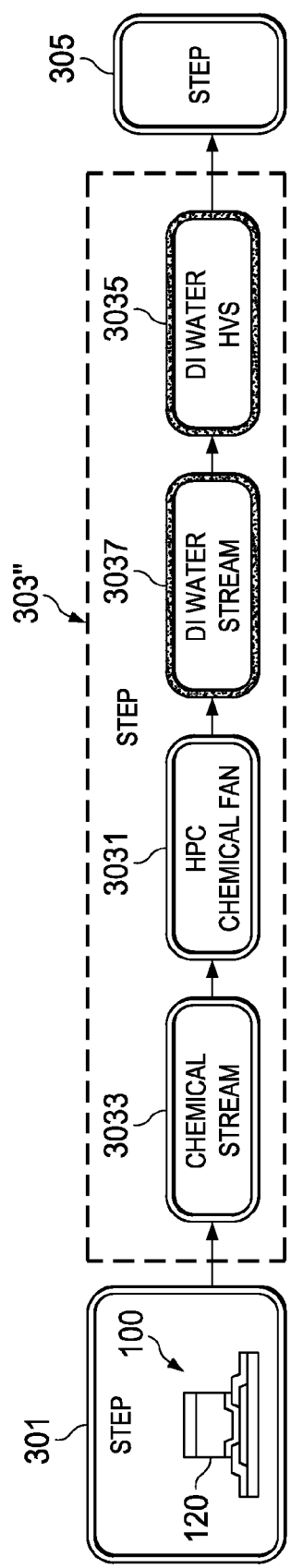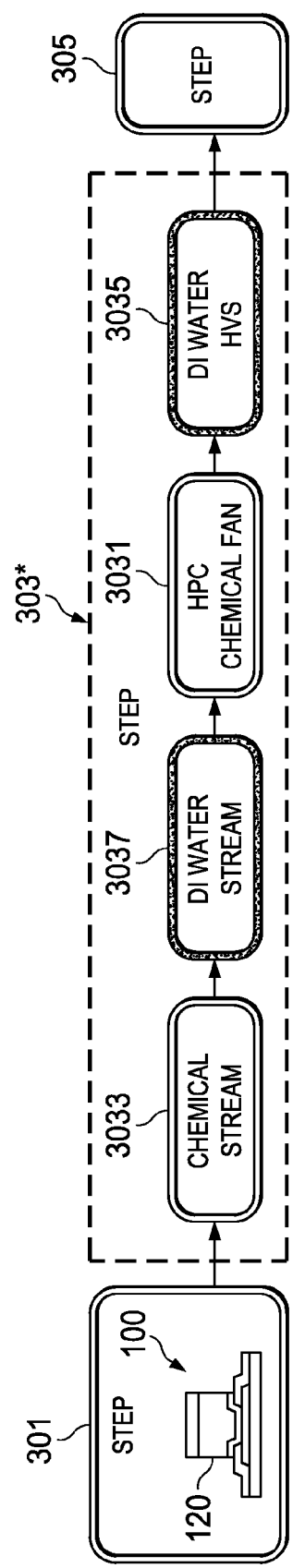

… (1)

CLEANING METHODS AND COMPOSITIONS

RELATED APPLICATIONS

This application claims priority to U.S. Provisional Application No. 61/635,098, filed on Apr. 18, 2012, entitled "Methods and Compositions for Removal of Sidewall Polymer in Packages," which is herein incorporated by reference.

BACKGROUND

Integrated circuit (IC) packaging is a step closer to the final stage of semiconductor device fabrication, followed by IC testing. An individual die, which represents the core of the device, is encased in a support that prevents physical damage and corrosion, and supports the electrical contacts required to assemble the IC into a system. IC packaging generally comprises the steps or the technology of mounting and interconnecting devices. The earliest integrated circuits were packaged in ceramic flat packs. Other current packaging technologies include ball grid array (BGA) packages, flip-chip packages, and many more. When multiple dies are stacked in one package, it is called a system in package (SiP), or a three-dimensional circuit.

An IC may comprise transistors formed on a substrate. An interconnect structure, which includes metal lines and vias may be formed therein to connect transistors and devices. Metal pads may be formed over the interconnect structure. Additional packaging metal interconnects such as under-bump-metallurgy (UBM) layers, post passivation interconnects, and redistribution layers may be formed in the packaging process over the metal pads. Various polymer layers may be formed to separate and support the metal interconnects in the packages.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3A-3D illustrate a plurality of cleaning processes for cleaning residues on a metal contact in accordance with various embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

Embodiments will be described with respect to a specific context, namely cleaning methods and compositions for metal contacts. The metal contacts may be used for packaging purposes. Embodiments may also be applied, however, to other metal contacts.

Figure 1A:
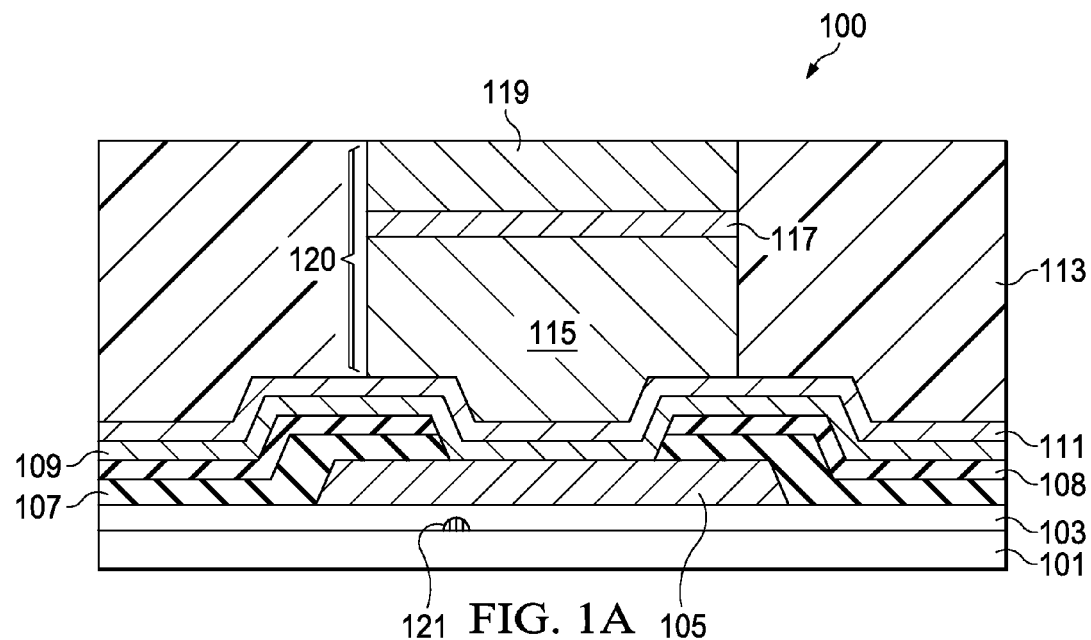
FIGS. 1A-1C illustrate a metal contact in accordance with an embodiment.

With reference now to FIG. 1A, there is shown a portion of an embodiment of a semiconductor device 100. In an embodiment, the semiconductor device 100 may comprise a substrate 101, active devices 121, metallization layers 103, a contact pad 105, a passivation layer 107, a polymer layer 108, an under-bump-metallurgy (UBM) layer 109, a UBM seed layer 111, and a polymer layer 113, etc., with an opening. A contact 115 may be formed within the opening of the polymer layer 113, together with a first cap layer 117 and a second cap layer 119.

The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices 121 may be formed on the semiconductor substrate 101. As one of ordinary skill in the art will recognize, a wide variety of active devices and passive devices such as capacitors, resistors, inductors, and the like may be used to generate the desired structural and functional requirements of the design for the semiconductor device 100. The active devices 121 may be formed using any suitable methods, either within or on the semiconductor substrate 101.

However, as one of ordinary skill will recognize, the above described substrate 101 with active devices 121 is not the only substrate that may be used. Alternative substrates, such as a package substrate or an interposer that does not have active devices therein, may alternatively be utilized. These substrates and any other suitable substrates may alternatively be used and are fully intended to be included within the scope of the present embodiments.

The metallization layers 103 are formed over the semiconductor substrate 101 and the active devices 121 and are designed to connect the various active devices to form functional circuitry. While illustrated in FIG. 1A as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor device 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 μm and about 4 μm, such as about 1.45 μm.

The passivation layer 107 may be formed on the semiconductor substrate 101 over the metallization layers 103 and the contact pad 105. The passivation layer 107 may be made of one or more suitable dielectric materials such as silicon oxide, silicon nitride, polyimide, low-k dielectrics such as carbon doped oxides, extremely low-k dielectrics such as porous carbon doped silicon dioxide, combinations of these, or the like. The passivation layer 107 may be formed through a process such as chemical vapor deposition (CVD), although any suitable process may be utilized, and may have a thickness between about 0.5 μm and about 5 μm, such as about 9.25 KÅ.

The polymer layer 108 may be formed on the passivation layer 107. The polymer layer 108 may be made of materials such as polyimide, polybenzoxazole (PBO), combinations of these and the like. The formation methods include spin coating or other commonly used methods. The thickness of the polymer layer 108 may be between about 4 μm and about 5 μm.

After the passivation layer 107 and the polymer layer 108 have been formed, an opening may be made through the passivation layer 107 and the polymer layer 108 by removing portions of the passivation layer 107 and the polymer layer 108 to expose at least a portion of the underlying contact pad 105. The opening allows for contact between the contact pad 105 and the UBM layer 109 (discussed further below with respect to FIG. 1A). The opening may be formed using a suitable photolithographic mask and etching process, although any suitable process to expose portions of the contact pad 105 may be used.

The UBM layer 109 may be formed in electrical contact with the contact pad 105. The UBM layer 109 may comprise a layer of conductive material, such as a layer of titanium, or a layer of nickel. The UBM layer 109 may comprise multiple sub-layers, not shown. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM layer 109. Any suitable materials or layers of material that may be used for the UBM layer 109 are fully intended to be included within the scope of the current embodiments. The UBM layer 109 may be created using processes such as sputtering, evaporation, or PECVD process, depending upon the desired materials. The UBM layer 109 may be formed to have a thickness of between about 0.01 μm and about 10 μm, such as about 5 μm.

The UBM seed layer 111 may be formed in electrical contact with the UBM layer 109 on top of the contact pad 105. The UBM seed layer 111 is a thin layer of a conductive material that aids in the formation of a thicker layer during subsequent processing steps. The UBM seed layer 111 may comprise a layer of copper, which will be further used to connect to the contact 115. The UBM seed layer 111 may be created using processes, such as sputtering, evaporation, or PECVD process, depending upon the desired materials. The UBM seed layer 111 may be formed to have a thickness of between about 0.01 μm and about 10 μm, such as about 5 μm.

The polymer layer 113, such as a photoresist layer, etc., may be formed by coating on the UBM seed layer 111. The polymer layer 113 may comprise benzene-based polymers, dioxane-based polymers, toluene-based polymers, phenyl-thiol-based polymers, phenol-based polymers, cyclohexane-based polymers, p-cresol-based polymers, combinations of these and the like. The formation methods include spin coating or other commonly used methods. The thickness of the polymer layer 113 may be between about 5 μm and about 200 μm. The dimensions recited throughout the description are merely examples, and will change with the down-scaling of integrated circuits. An opening of the polymer layer 113 may be formed using photolithography techniques to expose a portion of the UBM seed layer 111 where the contact 115 will be formed.

The contact 115 comprises one or more conductive materials, such as copper, tungsten, solder (SnAg), or other conductive metals or the like, and may be formed, for example, by electroplating, electroless plating, or the like. In an embodiment, an electroplating process is used wherein the semiconductor device 100 is submerged or immersed in an electroplating solution. The semiconductor device 100 surface is electrically connected to the negative side of an external DC power supply such that the semiconductor device 100 functions as the cathode in the electroplating process. A solid conductive anode, such as a copper anode, is also immersed in the solution and is attached to the positive side of the power supply. The atoms from the anode are dissolved into the solution, from which the cathode, e.g., the semiconductor device 100, acquires the dissolved atoms, thereby plating the exposed conductive areas of the semiconductor device 100, e.g., the exposed portions of the UBM seed layer 111 within the opening of the polymer layer 113.

The first cap layer 117 may be formed over the contact 115. For example, in an embodiment in which the contact 115 is formed of copper, a first cap layer 117 formed of nickel may be desirable. Other materials, such as Pt, Au, Ag, Ni, Co, V, Cr, Sn, Pd, Bi, Cd, Zn, combinations thereof, or the like, may also be used. The first cap layer 117 may be formed through any number of suitable techniques, including PVD, CVD, ECD, MBE, ALD, electroplating, and the like. The first cap layer 117 may be of a thickness between about 0.01 um and about 10 um.

The second cap layer 119 may be formed on the first cap layer 117. The second cap layer 119 may be of solder materials comprising copper, SnAu, SnPb, a high-Pb material, a Sn-based solder, a lead-free solder, a SnAg solder, a SnAgCu solder, or other suitable conductive material. The second cap layer 119 may be formed through any number of suitable techniques, including PVD, CVD, ECD, MBE, ALD, electroplating, and the like. The second cap layer 119 may be of a thickness between about 0.01 um and about 50 um.

The number of layers on the contact 115, such as the first cap layer 117 and the second cap layer 119, is for illustration purposes only and is not limiting. There may be a different number of layers formed on the contact 115. The various layers on the contact 115 may be formed with different materials, of various shapes. The contact 115, the first cap layer 117, and the second cap layer 119 may collectively be called a metal contact 120.

Figure 1B:
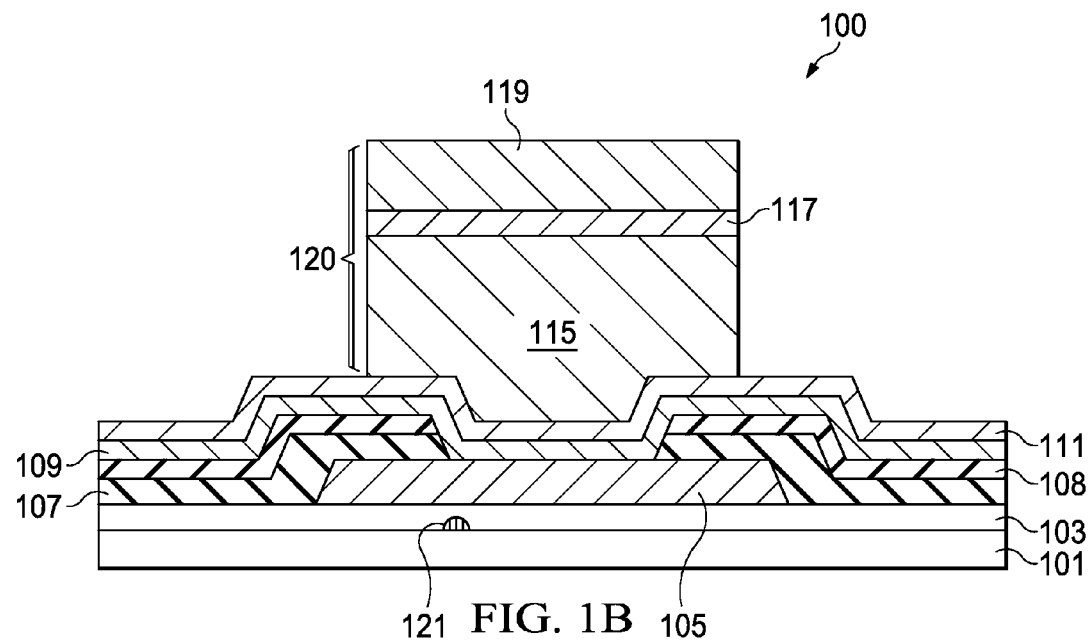

FIG. 1B illustrates the semiconductor device structure 100 once the polymer layer 113 has been stripped away. In an embodiment, a plasma ashing process and a wet stripping process may be used to remove the polymer layer 113, whereby the temperature of the polymer layer 113 may be increased until the polymer layer 113 experiences a thermal decomposition and may be removed. However, any other suitable process, such as a wet strip, may alternatively be utilized. The removal of the polymer layer 113 may expose the underlying portions of the UBM seed layer 111.

After the polymer stripping to remove the polymer layer 113, there may be a variety of residues left on the side walls or upper surfaces of the metal contact 120. The residues may comprise leftover polymer, metal and polymer complex, and CuO. There is a need to clean those residues on the side walls or upper surfaces of the metal contact 120, efficiently and effectively.

Figure 1C:
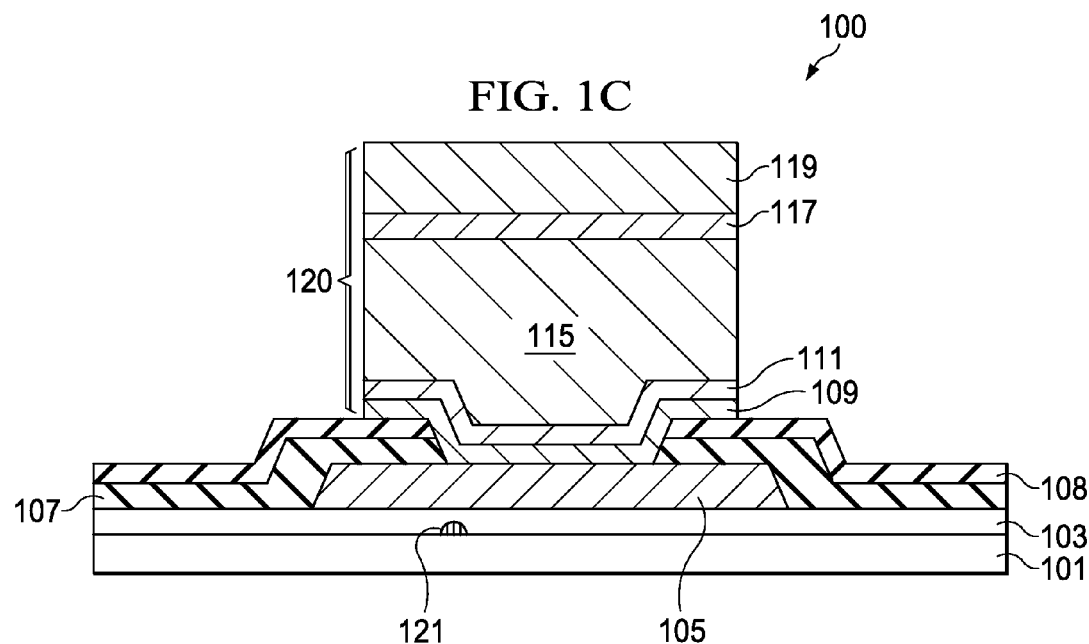

FIG. 1C illustrates a removal of the exposed portions of the UBM see layer 111 and UBM layer 109. The exposed portions of the UBM seed layer 111 may be removed by, for example, a wet etching process. The wet etching may be done by using wet etching solutions containing an oxidizing agent and a complexing agent. In addition, the etching solutions may optionally include one or more pH adjustors. The semiconductor device 100 may be in contact with the wet etching solution, including but not limited to by spraying the etching solution on the semiconductor device 100, or by immersing the semiconductor device 100 into solution. After the exposed portion of the UBM seed layer 111 has been etched away, a portion of the UBM layer 109 will be exposed.

The exposed portions of the UBM layer 109 may then be removed by, for example, a dry etching process. The dry etching may be done using chemicals such as, $CF_4$, or $CHF_3$. Any existing etching technology or future developed etching technology may be used. After the UBM layer 109 has been etched away, a portion of the passivation layer 107 will be exposed.

After wet etching and dry etching, there may be a variety of residues left on the side walls or upper surfaces of the metal contact 120 comprising the contact 115, the first cap layer 117, and the second cap layer 119. The residues may comprise $Cu_xF_y$, polymer-Ti complex, $Sn_xF_y$, $TiF_3$, $TiF_4$, or other etching residues. There is a need to clean those residues on the side walls or upper surfaces of the metal contact 120 comprising the contact 115, the first cap layer 117, and the second cap layer 119, efficiently and effectively.

Figure 2:
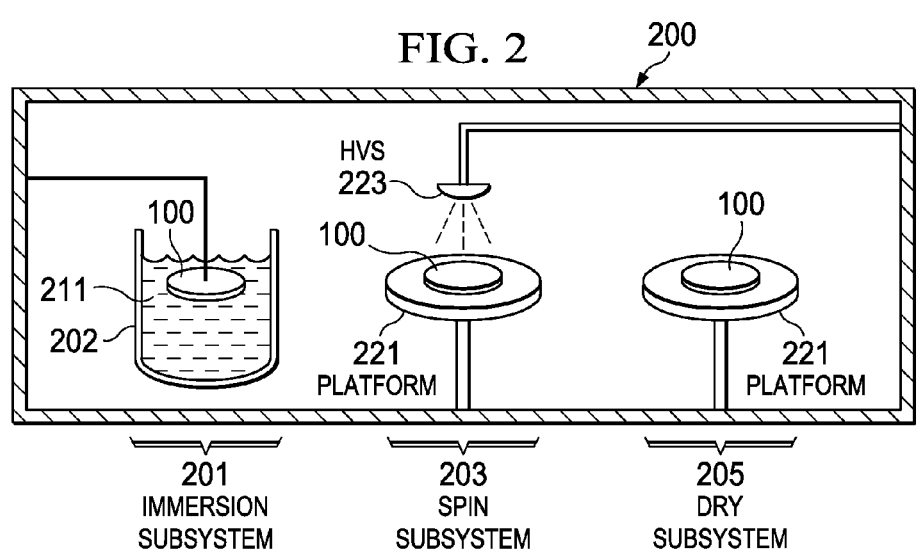
FIG. 2 illustrates a cleaning system for cleaning residues on a metal contact in accordance with an embodiment.

FIG. 2 illustrates a cleaning system 200 that cleans the residues on the sidewalls of the metal contact 120 shown in FIG. 1C using deionized (DI) water and a chemical solvent. More details of DI water and the chemical solvent will be described later. The cleaning system 200 may comprise three subsystems: an immersion subsystem 201, a spin subsystem 203, and a dry subsystem 205, and may include, e.g., processing stations by vendors such as Solid State Equipment LLC.

The semiconductor device 100 may be first immersed in a chemical solvent 211 in, e.g., a tank 202 of the immersion subsystem 201, then moved to the spin subsystem 203 for further cleaning, and finally to the dry subsystem 205 for drying. Alternatively, the spin subsystem 203 and the dry subsystem 205 may reside in the same chamber. There may be a plurality of semiconductor devices 100 processed together in a batch, or each semiconductor device 100 is processed individually. The spin subsystem 203 may comprise a platform 221 where the semiconductor device 100 may be placed. The spin subsystem 203 may further comprise a high velocity spray (HVS) 223 to spray chemical solvent 211 or DI water to the semiconductor device 100 to be cleaned. The HVS 223 may be able to operate at a high pressure and a high velocity or at a low pressure and a low velocity as described further below. Alternatively, there may be two sprays within the spin subsystem 203, where one spray is used in high pressure or high velocity case, and another spray is used in low pressure and low velocity.

The system in FIG. 2 may be used to perform any of the cleaning process illustrated below in FIGS. 3A-3D. The immersion subsystem 201 of the clean system may perform the immersion step 301 illustrated in FIGS. 3A-3D. The spin subsystem 203 may perform the spray step 303 of the clean process, or its variations spray step 303', spray step 303", and spray step 303*, illustrated in FIGS. 3A-3D using the platform 221 and the HVS 223. The dry subsystem 205 may perform the dry step 305 of the clean process illustrated in FIGS. 3A-3D.

Figure 3A:
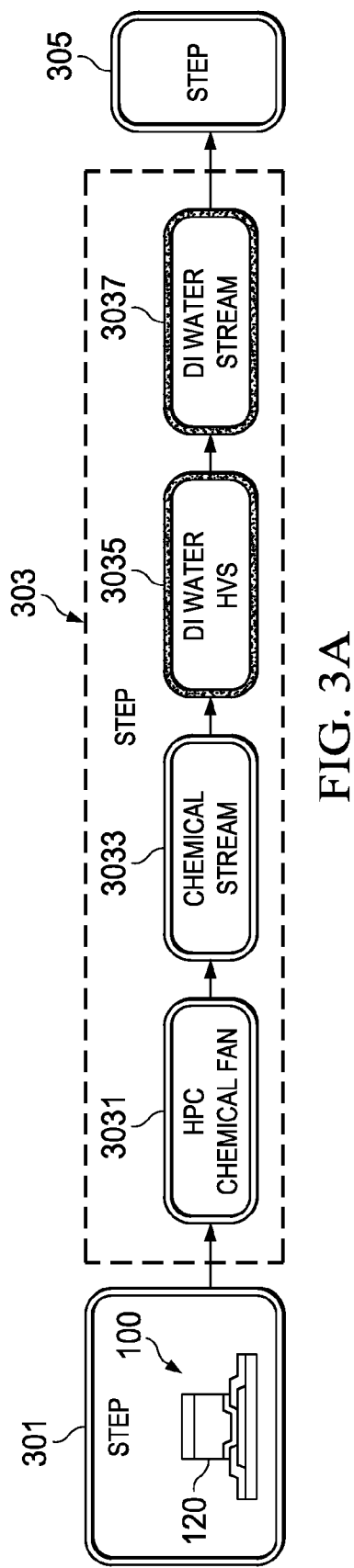

An embodiment of a cleaning process is illustrated in FIG. 3A to clean the residues on the side walls or upper surfaces of the metal contact 120 of the semiconductor device 100. The semiconductor device 100 comprising the metal contact 120 or a plurality of metal contacts may be initially immersed (dipped) in the chemical solvent 211 at immersion step 301. In an embodiment, at the immersion step 301, a robot arm or any other conventional remote operation means may be used to transport the semiconductor device 100 into the chemical solvent 211. The chemical solvent 211 may be normally maintained at a temperature within a range of about 50° C. to about 150° C. After a suitable time period of immersion in the chemical solvent 211, for example, about 10 to 90 minutes, the semiconductor device 100 may be moved to the spray step 303.

In an embodiment, the chemical solvent 211 used in the cleaning process may comprise: a reactive inorganic component at a first percentage; a reactive organic component such as an alkylamine at a second percentage; a chelating agent at a third percentage; an organic solvent at a fourth percentage; and water (H2O) at a fifth percentage. The first percentage, the second percentage, the third percentage, the fourth percentage, and the fifth percentage may be added to a total 100%. In some other alternative embodiments, they may be added to less than 100%. All percentages are measured by weight.

In an embodiment, the reactive inorganic component may be, e.g., potassium hydroxide (KOH). KOH is a strong chemical base with consequent ability to degrade many materials. The corrosive properties of KOH make it a useful ingredient in agents and preparations that clean surfaces and materials. In an embodiment, KOH may be present at the first percentage ranged from about 0.5% to about 30%. The KOH may be used to degrade and remove the residues such as CuO, leftover polymer, metal and polymer complex, which are produced at the polymer stripping process, or CuxFy, polymer-Ti complex, or SnxFy, which are produced at the wet etching and dry etching process.

The reactive organic component may be an alkylamine such as an ethanolamine (MEA), or a cyclohexylamine, and so forth. The MEA is an organic chemical compound that is both a primary amine and a primary alcohol (due to a hydroxyl group). The reactive organic component may be at the second percentage ranged from about 0.5% to about 50%. The alkylamine may be used to react with and clean the $Cu_xF_y$, $Sn_xF_y$, $TiF_3$, and $TiF_4$ produced at the wet etching and dry etching process and which are not removed by the reactive inorganic component. The alkylamine may also be used to clean metal and polymer complex produced at the polymer stripping process. The inclusion of the reactive organic component in the chemical solvent 211 can make the chemical solvent 211 more effective to remove above mentioned residues, therefore reducing the cleaning steps may be needed in other conventional process.

The chelating agent is a chemical compound that coordinates with a metal to form a chelate, often used to trap or remove heavy metal ions. The chelating agent may be a 3-methyl-3-methoxybutanol (MMB), and a tetrahydrofurfuryl alcohol (THFA). The chelating agent may be at the third percentage ranged from about 0.5% to about 50%. The THFA may be used to react and trap heavy metals or metal complex such as Cu or other similar metals in the cleaning process. The MMB may help the reactive inorganic component to improve the cleaning results and efficiency.

The organic solvent may be a 1-methyl-2-pyrrolidinone (NMP), a dimethyl sulfoxide (DMSO), a 1-nitropropane, or combinations thereof. Due to its good solvency properties NMP may be used to dissolve a wide range of chemicals such as polymers. Similarly, DMSO and 1-nitropropane may be used to strip the polymer residues. The organic solvent may be at the fourth percentage ranged from about 0.5% to about 90%. Both NMP and DMSO may be used together in a chemical solvent. In order to achieve a higher efficiency for the chemical solvent, the precise ratio of DMSO and NMP use may be based in part according to the composition of the polymer to be removed.

Finally, the solvent may comprise water ($H_2O$) at the fifth percentage ranged from about 0.1% to about 50%. Water is used in the chemical solvent 211 to assist with the removal of the particles and residues. Additionally, because KOH and MMB react together to form $H_2O$, the addition of outside $H_2O$ as a component in the chemical solvent helps to reduce the reaction between KOH and MMB, and to maintain the levels of KOH and MMB in the chemical solvent 211.

More details of the spray step 303 are illustrated in FIG. 3A. Basic spin operations performed in the spray step 303 may comprise a high pressure control spray (HPC) chemical fan operation 3031, a chemical stream operation 3033, a DI water high velocity spray (HVS) operation 3035, and a DI water stream operation 3037. The HPC chemical fan operation 3031 and chemical stream operation 3033 may be performed using the chemical solvent 211 described previously. The DI water HVS operation 3035 and the DI water stream operation 3037 may be performed using DI water.

At the HPC chemical fan operation 3031, the semiconductor device 100 comprising the metal contact 120 to be cleaned may be placed on the platform 221, which may be able to spin at different speeds or revolutions per minute (RPM). The high velocity spray (HVS) 223 may spray the chemical solvent 211 onto the semiconductor device 100 and metal contact 120 using a high pressure. For example, the HVS 223 may spray the chemical solvent 211 at a pressure from about 10 psia to about 2000 psia.

The HPC chemical fan operation 3031 may be performed at different speeds of rotation for the platform and the semiconductor device 100. For example, the HPC chemical fan operation 3031 may be first performed at about 45 RPM and then the rotational speed may be increased to 150 RPM. Thereafter, the speed may be decreased to 55 RPM again, is increased again to 250 RPM, is decreased again to 65 RPM, and then is increased again to 600 RPM. By varying and increasing the rotational speed in this manner, the polymer or residue removal effect can be enhanced and the reaction in which the polymers or residue are removed by the chemical solvent 211 is promoted. The intermediate low-speed rotation period allows the semiconductor device 100 to be wetted with the chemical solvent 211. Thereafter, by rotating the semiconductor device at a high speed, for example, at about 600 RPM, the chemical solvent 211 in which the polymers or residues are dissolved is removed and discharged. As such, the polymer or residues removing effect of the chemical solvent 211 can be enhanced.

At the chemical stream operation 3033, the semiconductor device 100 comprising the metal contact 120 to be cleaned may be left on the same platform 221, remain in the same machine. However, during the chemical stream operation 3033, the HVS 223 may spray the chemical solvent 211 onto the semiconductor device 100 using a normal pressure, which may be around 0.1 psia to about 100 psia.

The chemical stream operation 3033 may also be performed at different speeds of rotation. For example, while the chemical solvent 211 is being sprayed, the chemical stream operation 3033 may be first performed at about 45 RPM and then the rotational speed is increased to 150 RPM. Thereafter, the speed is decreased to 55 RPM again, is increased again to 250 RPM, is decreased again to 65 RPM, and then is increased again to 600 RPM. By varying and increasing the rotational speed in this manner, the polymer or residue removal effect can be enhanced and the reaction in which the polymers or residue are melted in the chemical solvent 211 is promoted. The intermediate low-speed rotation period allows the semiconductor device to be wet with the chemical solvent 211. Thereafter, by rotating the semiconductor device at a high speed, for example, at about 600 RPM, the chemical solvent 211 in which the polymers or residues are dissolved is removed and discharged. However, in some other situations, it may be advantageous to perform the chemical stream operation 3033 at a same speed.

In the HPC chemical fan operation 3031 and the chemical stream operation 3033, the chemical solvent 211 may clean a variety of residues left on the sidewalls or upper surfaces of the metal contact 120 after the polymer stripping and etching, such as a metal and polymer complex, a polymer, a $Cu_xF_y$, a polymer-Ti complex, a CuO, a $Sn_xF_y$, a $TiF_3$, a $TiF_4$, or other etching residues. There may be multiple such residues on a surface of the metal contact 120 to be removed. The HPC chemical fan operation 3031 operates at a high pressure to provide faster speed for the chemical reaction, and the chemical stream operation 3033 operates at a lower pressure so that more chemical solvent 211 may be sprayed onto the semiconductor device 100 and more time for the chemical solvent 211 to be absorbed by the semiconductor device 100.

At the DI water HVS operation 3035, the semiconductor device 100 comprising the metal contact 120 to be cleaned may remain on the same platform 221. In the DI water HVS operation 3035, the high velocity spray (HVS) 223 may spray DI water using a high pressure to the semiconductor device being cleaned. For example, the HVS 223 may spray DI water at a pressure from about 10 psia to about 100 psia. During the previous steps of HPC chemical fan operation 3031 and the chemical stream operation 3033, KOH used in the chemical solvent 211 may have reacted to form crystals on the surface of the semiconductor device 100. Using a high pressure and a high velocity in the DI water HVS operation 3035 helps to remove the crystallized KOH products from the surface of the semiconductor device 100.

The DI water HVS operation 3035 may be performed at different speeds of rotation. For example, the DI water HVS operation 3035 may be first performed at about 45 RPM and then the rotational speed is increased to 150 RPM. Thereafter, the speed is decreased to 55 RPM again, is increased again to 250 RPM, is decreased again to 65 RPM, and then is increased again to 600 RPM. By varying and increasing the rotational speed in this manner, the polymer or residue removal effect can be enhanced. The intermediate low-speed rotation period allows the semiconductor device to be wetted with the DI water. Thereafter, by rotating the semiconductor device at a high speed, for example, at about 600 RPM, the polymers or residues are removed and discharged. However, in some other situations, it may be advantageous to perform the DI water HVS operation 3035 at a same speed.

At the DI water stream operation 3037, the semiconductor device 100 comprising the metal contact 120 to be cleaned may remain on the same platform 221. The HVS 223 may spray DI water using a low pressure instead of high pressure, which may be around 0.1 psi to 100 psi, to the semiconductor device 100 being cleaned.

The DI water stream operation 3037 may be performed at different speeds of rotation. For example, the DI water stream operation 3037 may be first performed at about 45 RPM and then the rotational speed is increased to 150 RPM. Thereafter, the speed is decreased to 55 RPM again, is increased again to 250 RPM, is decreased again to 65 RPM, and then is increased again to 600 RPM. By varying and increasing the rotational speed in this manner, the polymer or residue removal effect can be enhanced. The intermediate low-speed rotation period allows the semiconductor device to be wetted with the DI water. Thereafter, by rotating the semiconductor device at a high speed, for example, at about 600 RPM, the polymers or residues are removed and discharged. However, in some other situations, it may be advantageous to perform the DI water stream operation 3037 at a same speed.

The various basic steps such as the HPC chemical fan operation 3031, the chemical stream operation 3033, the DI water HVS operation 3035, and the DI water stream operation 3037 may be performed in the same spin subsystem 203 of the system 200 illustrated in FIG. 2. The semiconductor device 100 may be placed on the platform 221 during all the operations without moving in or out of the spin subsystem 203. Furthermore, the same HVS 223 may be used to perform all the operations with different pressures, velocity, using the chemical solvent 211 or DI water. The sharing of the single spin subsystem 203 among all the operations of the spray step 303 can further improve the cleaning efficiency, by reducing the amount of transfer between stations.

Figure 3B:
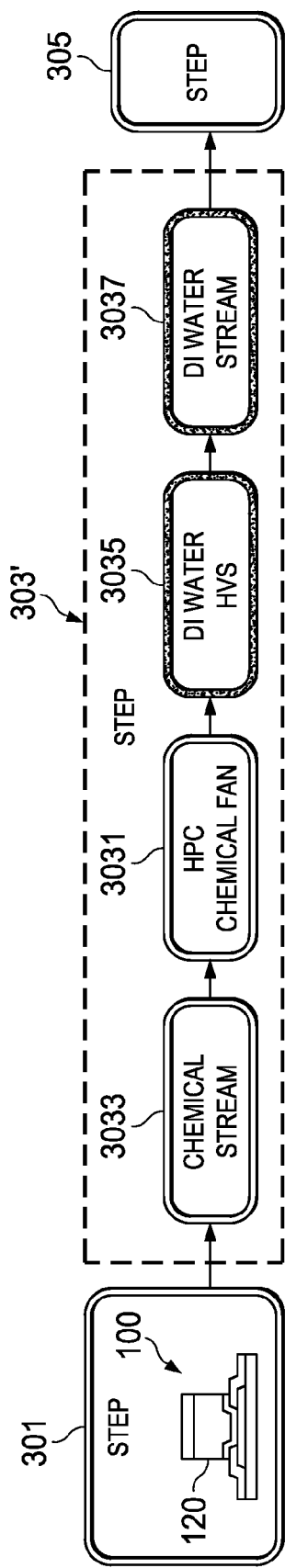

The spray step 303 may be performed in variations of the sequences of the basic spin operations comprising the HPC chemical fan operation 3031, the chemical stream operation 3033, the DI water HVS operation 3035, and the DI water stream operation 3037 as described above. As illustrated in FIG. 3B as one alternative, the spray step 303' may start with the chemical stream operation 3033, then the HPC chemical fan operation 3031, followed by DI water HVS operation 3035, and then DI water stream operation 3037. As illustrated in FIG. 3C as yet another embodiment, the spray step 303" may start with the chemical stream operation 3033, then the HPC chemical fan operation 3031, followed by the DI water stream operation 3037, and then DI water HVS operation 3035. As illustrated in FIG. 3D as yet another embodiment, the spray step 303\* may start with the chemical stream operation 3033, then the DI water stream operation 3037, followed by the HPC chemical fan operation 3031, and then DI water HVS operation 3035.

Additionally, more possible sequences are not illustrated as variations to the step 303, step 303', step 303", and step 303\*. In yet another embodiment, a spray step may start with the chemical stream operation 3033, then the HPC chemical fan operation 3031, followed by DI water stream 3037 operation, and then DI water HVS 3035 operation, and then stop. In yet another embodiment, a spray step may start with the HPC chemical fan operation 3031 and chemical stream operation 3033, and then stop. In yet another embodiment, a spray step may start with the HPC chemical fan operation 3031 and chemical stream operation 3033, followed by a plurality of cycles of a sequence of operations, wherein a cycle of the sequence of operations comprises: performing a DI water HVS operation 3035 at a pressure from about 10 psia to about 100 psia; and performing a DI water stream operation 3037, before it stops. Any suitable combination of the described steps may alternatively be utilized.

The choice of various basic spin operations may depend at least in part on the semiconductor devices 100, the metal contact 120 to be cleaned, the material of the polymer or residues, and other related parameters. Additionally, the sequence for the basic spin operations at the spray step 303, step 303', step 303", and step 303\* may be programmed and may be performed in any desired sequence as will be readily determined by those skilled in the art. In addition, there may be other means for controlling the ambient environment, for example, controlling humidity and oxygen levels as well as providing filtered re-circulated ambient as is known in the art, which may be programmed as well.

Once the metal contact 120 has been cleaned, the dry step 305 is performed in the dry subsystem 205 illustrated in FIG. 2, where the spin subsystem 203 and the dry subsystem 205 may reside in the same chamber. In an embodiment, at the dry step 305, a robot arm or any other conventional remote operation means may be used to transport the semiconductor device 100 into the dry subsystem 205. There may be a plurality of semiconductor devices 100 processed together in a batch, or each semiconductor device 100 is processed individually. The dry subsystem 205 may dry the semiconductor device 100 using, e.g., a spin dryer. In the spin drying, the semiconductor device 100 is dried by rotating the semiconductor device 100 at a high speed to blow off the moisture on the surface by the centrifugal force. Any other drying system may be used as well.

A method of cleaning a semiconductor device is disclosed. The method comprises: spraying a semiconductor device with a chemical solvent at a first pressure, and spraying the semiconductor device with the chemical solvent at a second pressure less than the first pressure.

A semiconductor device cleaning solution is disclosed. The semiconductor device cleaning solution comprises a reactive inorganic component and a reactive organic component.

A residue cleaning method is disclosed. The residue cleaning method comprises: performing a control spray chemical fan operation at a first pressure on a semiconductor device using a chemical solvent, wherein the chemical solvent comprises a reactive inorganic component and a reactive organic component; and performing a chemical stream operation on the semiconductor device using the chemical solvent at a second pressure different from the first pressure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of cleaning a semiconductor device, the method comprising:
providing a chemical solution consisting of potassium hydroxide (KOH), ethanolamine (MEA), an organic solvent, water, and a chelating agent, the chelating agent is at least one of 3-methyl-3methoxybutanol (MMB) or tetrahydrofurfuryl alcohol (THFA);
separately adding additional water to the chemical solution to reduce reaction between the chelating agent and the KOH;
cleaning a semiconductor device by:
first spraying the semiconductor device with the chemical solution at a first pressure; and
second spraying the semiconductor device with the chemical solution at a second pressure less than the first pressure.

2. The method of claim 1, wherein the first pressure is between about 10 psia and about 2000 psia.

3. The method of claim 1, further comprising spraying the semiconductor device with water at a third pressure, the third pressure being between about 10 psia and about 100 psia.

4. The method of claim 1, further comprising performing a plurality of cycles of a sequence of operations, wherein each one of the plurality of cycles of the sequence of operations comprises:
spraying the semiconductor device with additional water at a third pressure, the third pressure being between about 10 psia and about 100 psia; and
spraying the semiconductor device with additional water at a fourth pressure, the fourth pressure being less than the third pressure.

5. The method of claim 1, wherein spraying the semiconductor device with the chemical solution at the first pressure is first performed at a first speed, and then is performed at a second speed which is faster than the first speed.

6. The method of claim 1, wherein the semiconductor device comprises a metal contact, and wherein the metal contact comprises a contact, a first cap layer, and a second cap layer.

7. The method of claim 1, wherein spraying the semiconductor device with the chemical solution at the first pressure is performed in a first chamber, and spraying the semiconductor device with the chemical solution at the second pressure is performed in the first chamber.

8. The method of claim 3, further comprising spraying the semiconductor device with water at a fourth pressure, the fourth pressure being less than the third pressure.

9. A residue cleaning method, comprising:
providing a chemical solution, the chemical solution consisting of potassium hydroxide (KOH), a reactive organic component is at least one of ethanolamine (MEA) or cyclohexylamine, an organic solvent, water, and a chelating agent, the chelating agent is at least one of 3-methyl-3methoxybutanol (MMB) or tetrahydrofurfuryl alcohol (THFA), the chelating agent having a first concentration, the KOH having a second concentration;
separately adding additional water to the chemical solution, the additional water maintaining at least one of the first concentration or the second concentration;
cleaning residue from a semiconductor device by:
performing a control spray chemical fan operation at a first pressure on the semiconductor device using the chemical solution; and
performing a chemical stream operation on the semiconductor device using the chemical solution at a second pressure different from the first pressure.

10. The residue cleaning method of claim 9, wherein the KOH has a concentration by weight from about 0.5% to about 30%, the organic solvent has a concentration by weight from about 0.5% to about 90%, and the reactive organic component has a concentration by weight from about 0.5% to about 50%.

11. The residue cleaning method of claim 9, further comprising:
spraying the semiconductor device with additional water at a third pressure, the third pressure being between about 10 psia and about 100 psia; and
spraying the semiconductor device with additional water at a fourth pressure, the fourth pressure being less than the third pressure.

12. The residue cleaning method of claim 9, wherein the control spray chemical fan operation is first performed at a first speed, and the chemical stream operation is performed at a second speed which is faster than the first speed.

13. The residue cleaning method of claim 9, further comprising spraying the semiconductor device with water at a third pressure, the third pressure being between about 10 psia and about 100 psia.

14. The method of claim 9, wherein the first pressure is between about 10 psia and about 2000 psia.

15. The method of claim 13, wherein the first pressure is between about 10 psia and about 2000 psia.

16. A method comprising:
providing a semiconductor device;
providing a chemical solution consisting of a reactive inorganic base, a reactive organic base, an organic solvent, water, and a chelating agent, the chelating agent is at least one of 3-methyl-3methoxybutanol (MMB) or tetrahydrofurfuryl alcohol (THFA), the chelating agent having a first concentration by weight, the reactive inorganic base having a second concentration by weight, the reactive organic base having a third concentration by weight;
separately adding additional water to the chemical solution, the additional water having a fourth concentration, wherein the first concentration is between about 0.5% and about 50%, the second concentration is between about 0.5% and about 30%, the third concentration is between about 0.5% and about 50%, the fourth concentration is between about 0.1% and about 50%; and
cleaning the semiconductor device by spraying the semiconductor device with the chemical solution at a first pressure.

17. The method of claim 16, further comprising spraying the semiconductor device at a second pressure, lower than the first pressure, after spraying the semiconductor device at the first pressure.

18. The method of claim 16, wherein the first pressure is between about 10 psia and about 2000 psia.

19. The method of claim 17, wherein spraying the semiconductor device with the chemical solution at the first pressure is performed in a first chamber, and spraying the semiconductor device with the chemical solution at the second pressure is performed in the first chamber.

20. The method of claim 17, wherein the first pressure is between about 10 psia and about 2000 psia.

* * * * *